United States Patent [19]

Umemoto et al.

[11] Patent Number: 5,124,770

[45] Date of Patent: Jun. 23, 1992

[54] FIELD EFFECT TRANSISTOR WITH ALPHA PARTICLE PROTECTION

[75] Inventors: Yasunari Umemoto, Hachioji; Kiichi Ueyanagi, Kokubunji; Junji Shigeta, Fuchu; Norikazu Hashimoto, Hachioji, all of Japan

[73] Assignee: Hitachi, Ltd., Tokyo, Japan

[21] Appl. No.: 512,501

[22] Filed: Apr. 20, 1990

Related U.S. Application Data

[63] Continuation of Ser. No. 221,007, Jul. 18, 1988, abandoned, which is a continuation of Ser. No. 915,409, Oct. 6, 1986, abandoned.

[30] Foreign Application Priority Data

Oct. 7, 1985 [JP]    Japan ............................ 60-221841

[51] Int. Cl.$^5$ ................................................ H01L 29/80
[52] U.S. Cl. ........................................ 357/22; 357/16; 357/23.6; 357/41
[58] Field of Search ................ 357/22, 41, 16, 23.6, 357/63, 14

[56] References Cited

U.S. PATENT DOCUMENTS

| | | | |
|---|---|---|---|
| 4,247,862 | 1/1981 | Klein | 357/41 |
| 4,424,526 | 1/1984 | Dennard et al. | 357/14 |
| 4,605,945 | 8/1986 | Katayama et al. | 357/22 |
| 4,673,959 | 6/1987 | Shiraki et al. | 357/16 |
| 4,755,857 | 7/1988 | Abstreiter et al. | 357/22 |
| 4,864,382 | 9/1989 | Aoki et al. | 357/63 |

FOREIGN PATENT DOCUMENTS

| | | | |
|---|---|---|---|
| 2913068 | 10/1980 | Fed. Rep. of Germany | 357/22 MD |
| 55-95370 | 7/1980 | Japan | 357/22 MD |
| 57-196582 | 12/1982 | Japan | 357/22 |
| 58-119671 | 7/1983 | Japan | 357/22 MD |
| 58-140168 | 8/1983 | Japan | 357/22 MD |
| 60-134479 | 7/1985 | Japan | 357/22 |
| 61-7666 | 1/1986 | Japan | 357/22 A |
| 63-60569 | 3/1988 | Japan | 357/22 |

OTHER PUBLICATIONS

H. Lee, "High Energy Particle Absorber in Dynamic Mem.," IBM Tech. Discl. Bull., vol. 22, #7, Dec. 1979, pp. 2689-2690.
H. Sakaki, "Vel.-Mod. Trans (VMT)...," JAP. J.A.P., vol. 21, #6, Jun. 1982, pp. L381-L383.

Primary Examiner—Rolf Hille
Assistant Examiner—Steven Loke
Attorney, Agent, or Firm—Antonelli, Terry, Stout & Kraus

[57] ABSTRACT

An FET structure with improved α-particle immunity or soft error immunity particularly provided in a semi-insulating substrate. This structure includes some layer which can prevent both electrons and holes generated in a substrate by the incidence of α-particles from being injected into the FET.

29 Claims, 3 Drawing Sheets

FIELD EFFECT TRANSISTOR WITH ALPHA PARTICLE PROTECTION

This application is a continuation of application Ser. No. 07/221,007, filed Jul. 18, 1988, which is a continuation of application Ser. No. 915,409, filed Oct. 6, 1986 now abandoned.

BACKGROUND OF THE INVENTION

This invention relates to a field effect transistor (FET) and more particularly to a field effect transistor that is capable of improving α particle immunity or soft error immunity.

A typical structure of a GaAs MESFET device or element, which is a kind of FET using compound semiconductor, is illustrated in cross section in FIG. 1. As seen from the figure, in a semi-insulating GaAs substrate are provided an n type active layer 2, an n+ type source region 3 and an n+ type drain region 4 on which a gate electrode 7, a source electrode 5 and a drain electrode 6 are provided, respectively. The semi-insulating substrate is used for the purpose of reducing the parasitic capacitance generated between the FET device and the substrate, thereby realizing a high speed FET device. The FET device made directly on such a semi-insulating substrate is disclosed in e.g. an article by R. C. Eden in the Proceedings of the IEEE. Vol. 70, No. 1, pp 5-12 (Jan. 1982).

In the memory device, such as an SRAM (static random access memory) formed with such FETs, the stored information can be destroyed when α-particles are incident into the substrate. This phenomenon, called "soft error", was found by T. C. May and M. H. Woods in 1979 in the memory device fabricated using Si semiconductor elements (see IEEE Transaction Electron Device, ED-26, p2, 1979).

The mechanism of producing the soft errors in the memory device constituted by Si semiconductor elements are generally considered as follows. The memory information is held by the amounts of charge stored in the capacitors located at respective memory cells of a memory device in case of DRAM (dynamic random access memory), or held by the electric potentials at the nodes in respective memory cells in case of SRAM. When an α particle is incident on the memory cells, about $10^6$ pairs of electrons and holes are generated along the track of the α-particle in the Si substrate. These carriers diffuse or drift in the substrate to flow into the capacitors or nodes. Thus, the amounts of charge stored in the capacitors and the electric potentials at the nodes are greatly varied to destroy the stored information.

If $10^6$ pairs of the carriers are generated in total along the track of an α particle in the memory device constituted by the Si semiconductor elements, the total amount of charge flowing into the capacitors or nodes is 160 fC $(1.6 \times 10^{-19} \times 10^6 = 160 \times 10^{-15}C)$ at most assuming that all the carriers generated flow into there, and never exceeds 160 fC.

It had been considered that the soft errors are generated through a similar mechanism also in the SRAM constituted by the GaAs MESFET's made directly on the semi-insulating substrate. The inventors, however, found the following fact as a consequence of repeated measurements of the charge amount in the transistor operation of the GaAs MESFET's made directly on the semi-insulating substrate. The fact is that unlike the Si memory device, the incidence of an α particle appears to produce the charge amount several times as large as 160 fC which flows into the electrodes of MESFET's. This fact means that the memory device constituted by the GaAs MESFET's made directly on the semi-insulating substrate exhibits α-particle immunity lower than the Si memory device. This is considered to be caused by the reason that the memory device formed with GaAs MESFET's made directly on the semi-insulating substrate offers a mechanism of multiplying the carriers, i.e. electrons or holes, in response to the incidence of an α particle.

The inventors of this invention found the following carrier multiplication mechanism. The total charges of holes and electrons produced in the GaAs substrate upon the incidence of an α particle are respectively 160 fC and are equal. In the state where the drain is supplied with a voltage, electric lines of force run from the drain to the source and they facilitate the generated carriers to drift. Regarding the mobility that determines the drift speed of the carriers, the electron mobility is more than ten times as large as the hole mobility in GaAs. Therefore, even after the electrons re completely absorbed from the substrate to the drain, the holes remain in the substrate. Thus, the potential barrier for the electrons at the substrate side becomes low and the injection of electrons from the source side is facilitated. Thus, subsidiary current path is formed and so a current newly flows into the drain. The total amount of charge thus flowing into the drain becomes several times as large as 160 fC, which is observed as a carrier multiplication phenomenon. Therefore, it is considered that such a carrier multiplication mechanism can be suppressed by inducing the status where the holes don't remain in the substrate, i.e. a state where electrons are prevented to rapidly flow into the drain.

In this way, in order to prevent the soft error due to the incidence of α-particles in the memory device constituted by GaAs MESFET's made directly on the semi-insulating substrate, the above carrier multiplication mechanism as well as the mechanism common to the Si substrate must be taken into consideration.

In order to prevent the soft error due to the incidence of α particles, it has been proposed to form, below an active layer of the FET, an impurity layer having a conductivity type opposite to that of the active layer. This method, however, only prevents the intrusion of either the electrons or the holes generated because of the incidence of α-particles, and also is insufficient for preventing the above carrier multiplication mechanism.

A related prior art is also disclosed in JP-A-57-211783.

SUMMARY OF THE INVENTION

An object of this invention is to provide a field effect transistor (FET) with improved α-particle immunity or soft error immunity.

In order to attain this object, in accordance with this invention, there is provided an FET wherein between a first semiconductor layer and a second semiconductor layer is formed a structure consisting of a third semiconductor layer and a fourth semiconductor layer being alternately laminated, and serving as a potential barrier for electrons and holes, respectively, in the second semiconductor layer, or a fifth semiconductor layer serving as a potential barrier for both electrons and holes in the second semiconductor layer.

Because of such a construction of the FET of this invention, the electrons and holes generated in the second semiconductor layer are prevented from flowing into the first semiconductor layer by the third semiconductor layer serving as a potential barrier for the electrons, the fourth semiconductor layer serving as a potential barrier for the holes, or by the fifth semiconductor layer serving as a potential barrier for both electrons and holes. Thus, both electrons and holes remain in the second semiconductor layer and are annihilated through recombination thereof with the elapse of time. In this way, the carrier multiplication effect due to the incidence of α-particles can be suppressed, thereby preventing the soft error.

The above and other objects, features and advantages of this invention will be more clearly understood from the following detailed description taken in conjunction with the accompanying drawings.

BRIEF DESCRIPTION OF THE DRAWINGS

FIG. 2b is a view showing the band structure taken on line A—A' of FIG. 2a;

FIGS. 3a to 3d are cross sections showing the fabrication process of the FET shown in FIG. 2a;

FIG. 5b is a view showing the band structure taken on line B—B' of FIG. 5a.

DESCRIPTION OF THE PREFERRED EMBODIMENTS

This invention is aimed to provide an FET with improved α-particle immunity by means of such a structure as preventing the electrons and holes produced in a substrate by the incidence of α-particles from being injected into the FET.

This invention will be explained in more detail using its preferred embodiments.

EMBODIMENT 1

Figure 2A:
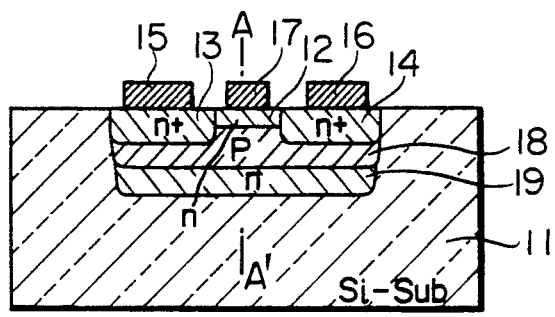
FIG. 2a is a cross section of the FET according to a first embodiment of this invention.

FIG. 2a shows the FET according to a first embodiment of this invention in its cross section. As seen from the figure, between an n-active layer 12 or n+-source, drain regions 13, 14 (wholly referred to as a first semiconductor layer) and a semi-insulating GaAs substrate (second semiconductor layer) are provided a p-type impurity doped layer 18 (third semiconductor layer) and an n-type impurity doped layer 19 (fourth semiconductor layer), adjacent to the first semiconductor layer; the third semiconductor layer 18 serves as a potential barrier for the electrons generated in the GaAs substrate 11 by the incidence of α-particles and the fourth semiconductor layer 19 serves as a potential barrier for the holes generated in the GaAs substrate 11 by the incidence of α-particles.

Figure 1:
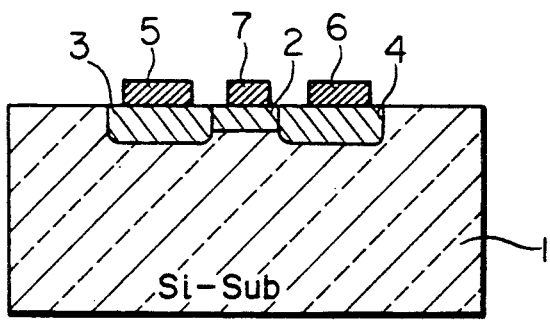
FIG. 1 is a cross section of the prior art field effect transistor (FET)
Figure 2B:
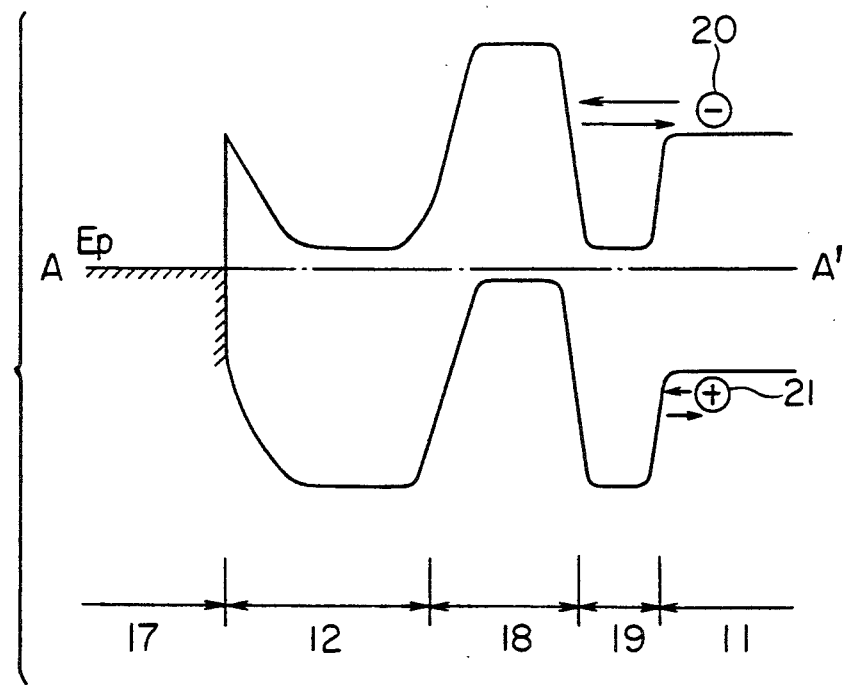

The band structure taken on line A—A' of the FET shown in FIG. 2a is shown in FIG. 2b. The electron 20 generated in the semi-insulating GaAs substrate 11 is prevented from flowing into the drain by the p-type impurity doped layer 18 which serves as a potential barrier for the electrons, and the hole 21, which is generated together with the electron 20 by the incidence of an α-particle, is prevented from flowing into the source by the n-type impurity doped layer 19 which serves as a potential barrier for the holes. Therefore, both electron and hole remain in the substrate without inducing the state where only the hole remains in the substrate and will be annihilated through the recombination process thereof with the elapse of time. In this way, the carrier multiplication effect due to the incidence of α-particles can be suppressed, thereby preventing the soft error. Incidentally, in the prior art FET structure shown in FIG. 1, the amount of charge flowing into the FET region upon incidence of one α-particle was about 800 fC whereas in the structure of Embodiment 1, the amount of charge having flowed was about 50 fC when the doses of the p-type impurity doped layer 18 and the n-type impurity doped layer 19 were $3 \times 10^{12} cm^{-2}$, respectively.

The fabrication process of the FET shown in FIG. 2a according to Embodiment 1 is shown in FIGS. 3a to 3d in cross section.

Figure 3A:
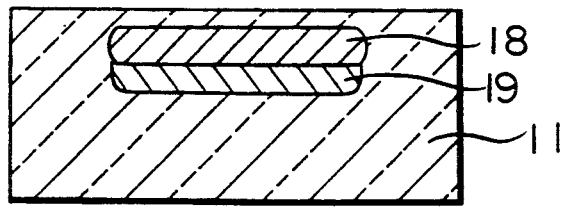

First, as shown in FIG. 3a, the p-type impurity doped layer 18 and n-type impurity doped layer 19 are formed in the semi-insulating GaAs substrate 11 through ion implantation. The doping impurity of the p-type layer 18 may be selected from Be, Mg, C, Zn, etc. The implantation energy may be generally selected in the range of 70 to 300 keV and the dose may be generally selected in the range of $1 \times 10^{11}$ to $1 \times 10^{13} cm^{-2}$ although they are dependent on the conditions of forming the n-active layer 12 and the n+-source and drain regions 13, 14 that will be later provided. The doping impurity of the n-type layer 19 may be selected from Si, Se, S, etc. The implantation energy may be generally selected in the range of 100 to 500 keV and the dose may be generally selected in the range of $1 \times 10^{11}$ to $1 \times 10^{13} cm^{-2}$ although they are dependent on the condition of forming the p-type doped layer 18.

Figure 3B:
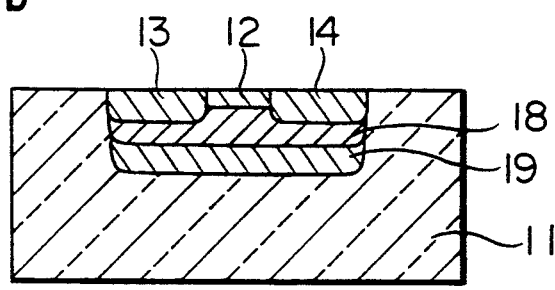

Then, as seen from FIG. 3b, the n-active layer 12 and n+-source and drain regions 13, 14 are formed in the semi-insulating GaAs substrate 11 through ion implantation.

Figure 3C:
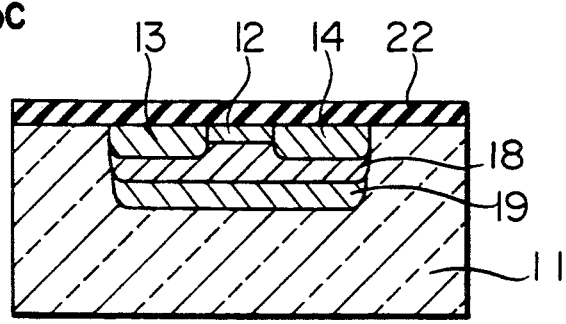
Figure 3D:
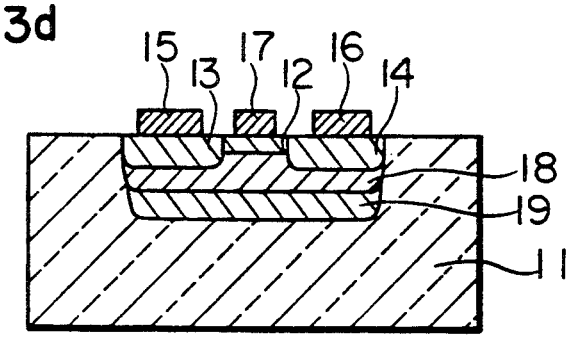

Then, as seen from FIG. 3c, an $SiO_2$ film 22, 2000 Å thick, is deposited on the surface of the semi-insulating substrate 11 and thereafter the defects in the implanted layers are annealed out and the doping impurities are electrically activated through a high temperature heat treatment at a temperature as high as 700° C. to 850° C.

Finally, the $SiO_2$ film 22 is removed out, and thereafter a source electrode 15 of an AuGe alloy, a drain electrode 16 of an AuGe alloy and a gate electrode 17 of Ti are formed, using the ordinary lift-off technique. Any other suitable material may be used for these electrodes.

The advantage or usefulness of this invention will be explained below. In the prior art FET as shown in FIG. 1, because the active layer 12, and source/drain regions 13, 14 are of the n-type, holes remain in the substrate 11, which give rise to the carrier multiplication effect. In contrast, where the active layer 12 and source/drain regions 13, 14 are made to have a p-type, the carrier multiplication effect is not caused since the holes remain in the substrate so that the injection of holes from the source is suppressed. However, even where the carrier multiplication effect is not caused, the total amount of charge flowing into the electrodes is about up to 140 fC, which is substantially equal to the total amount of charge generated by the incidence of an α-particle and still too large to obviate the soft error. This is the reason why this invention was necessitated.

In the structure of FIG. 2a, all the conductivity types may be reversed. Namely, the active layer 12 and source/drain regions 13, 14 may be made to have p-type, and the impurity doped layers 18 and 19 are formed to have n-type and p-type, respectively. Then, it is possible to reduce the total amount of charge flowing into the electrodes upon incidence of α-particles. This is because, as mentioned above, the holes are prevented from flowing into the drain by the n-type impurity doped layer serving as a potential barrier for the holes whereas the electrons are prevented from flowing into the source by the p-type impurity doped layer serving as a potential barrier for the electrons.

In this way, in accordance with the FET structure as shown in FIG. 2a, where the active layer is of n-type, the carrier multiplication effect is suppressed and also the total amount of charge flowing into the electrode can be suppressed less than that generated by the incidence of α-particles. Also, where the active layer is of p-type, the total amount of charge flowing into the electrode can be suppressed less than that generated by the incidence of α-particles. In any way, in accordance with the FET structure of this embodiment, α-particle immunity can be increased.

Although Embodiment 1 employs a semi-insulating compound semiconductor substrate, other kinds of substrates may be used to realize a band structure similar to that of FIG. 2b. Examples of such structure will be explained below.

(1) A p-type compound semiconductor substrate is adopted in place of the semi-insulating compound semiconductor substrate 11 such as GaAs. The conductivity types of other layers are the same as those in Embodiment 1.

(2) A p-type compound semiconductor substrate is adopted and a $p^-$-type impurity doped layer having $|N_A - N_D|$ smaller than that of the p-type impurity doped layer 18 and that of the p-type substrate is adopted in place of the n-type impurity doped layer 19, where $N_A$ and $N_D$ represent an acceptor impurity concentration and a donor impurity concentration in the $p^-$-type impurity doped layer (or the p-type impurity doped layer 18 or the p-type substrate). In the $p^-$-type impurity doped layer relative to the p-type substrate is formed a potential barrier for holes which has a barrier height equal to the difference in the Fermi level, $kT \ln |(N_A - N_D)/(N_{AS} - N_{DS})|$, where k is the Boltzmann's constant, T is absolute temperature of the FET, and $N_{AS}$ and $N_{DS}$ are an acceptor impurity concentration and a donor impurity concentration in the p type substrate, respectively.

(3) An n-type compound semiconductor substrate is adopted in place of the semi-insulating substrate 11 and an $n^+$-type impurity doped layer having $|N_D - N_A|$ larger than that of the n-type substrate is adopted in place of the n-type impurity doped layer 19 where $N_D$ and $N_A$ are a donor impurity concentration and an acceptor impurity concentration in the $n^+$-type impurity doped layer (or the n type substrate), respectively. Between the $n^+$-type impurity doped layer and the n-type substrate is formed a potential barrier for holes which has a barrier height equal to the difference in the Fermi level, $kT \ln |(N_D - N_A)/(N_{DS} - N_{AS})|$, where $N_{DS}$ and $N_{AS}$ are a donor impurity concentration and an acceptor impurity concentration in the n-type substrate, respectively.

EMBODIMENT 2

Figure 4:
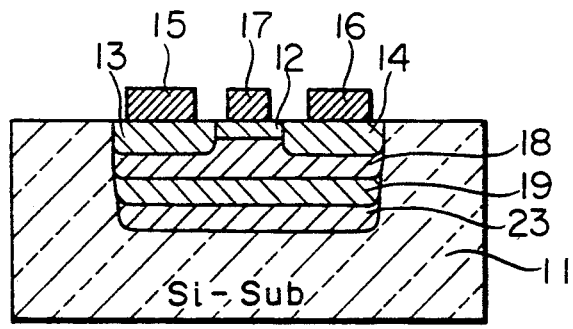
FIG. 4 is a cross section of the FET according to a second embodiment of this invention.

The FET structure according to a second embodiment of this invention is shown in FIG. 4 in cross section. This structure is similar to that of FIG. 2 except that a second p-type impurity doped layer 23 serving as a potential barrier for electrons is formed adjacently to the n-type impurity doped layer 19. This second p-type impurity doped layer 23, is formed by ion implantation and the subsequent high temperature heat treatment like the first p-type impurity doped layer 18 and the n-type impurity doped layer 19.

The doping impurity may be selected from Be, Mg, C, Zn, etc. The implantation energy and dose may be generally selected in the ranges of 100 to 600 keV and of $1 \times 10^{11} - 1 \times 10^{13} \text{cm}^{-2}$, respectively although they are dependent on the condition of forming the n-type impurity doped layer 19. The high temperature heat treatment may be generally carried out at the temperature of 700° to 850° C.

In accordance with the FET structure of this embodiment, the electrons generated in the substrate 11 are prevented from flowing into the drain by the p-type impurity doped layers 18 and 23 both of which serve as potential barriers for electrons, so that the carrier multiplication effect can be further suppressed as compared with the FET structure shown in FIG. 2a.

The carrier multiplication effect can be still further suppressed by alternately laminating respective pluralities of the p-type impurity doped layers and the n-type impurity doped layers. This can easily inferred from this embodiment.

The conductivity type of each layer in this embodiment can be reversed. In such a case also, the total amount of charge flowing into the electrodes can be suppressed, as mentioned above.

Although GaAs substrate has been described, other compound semiconductors such as InP, GaAlAs, InGaAs, InGaAsP, etc. can also be employed and the carrier multiplication effect therein can be suppressed similarly. This is caused because in the compound semiconductor, the electron mobility is generally larger by about one order of magnitude than the hole mobility so that holes will always remain in the substrate to cause the carrier multiplication. The FET structure of this embodiment which can greatly suppress the carrier multiplication effect due to remaining holes in the substrate is generally useful for compound semiconductors.

In accordance with this embodiment, the carrier multiplication effect can be suppressed also for an elementary semiconductor substrate such as Si, Ge, etc. although the effect itself is small.

EMBODIMENT 3

The FET structure according to a third embodiment of this invention is shown in FIG. 5 in cross section. This embodiment is characterized in that the potential barrier for electrons and that for holes are realized by the same layer. An undoped GaAlAs layer 24 and an GaAs layer 25 are formed on the semi-insulating GaAs substrate 11 through epitaxial growth. Thereafter, the n-type active layer 12, $n^+$-type source/drain regions 13, 14, source electrode 15, drain electrode 16 and gate electrode 17 are formed. The process and condition of forming these components will not be explained here since they are similar to those in the embodiment 1 shown in FIGS. 3a to 3d. The thickness of the undoped GaAs layer 25 may be generally selected in the range of 3,000 to 10,000 Å although it is dependent upon the condition of forming the n-type active layer 12 and the thickness of the undoped GaAlAs layer 24 may be selected in the range of 500 to 10000 Å.

Figure 5A:
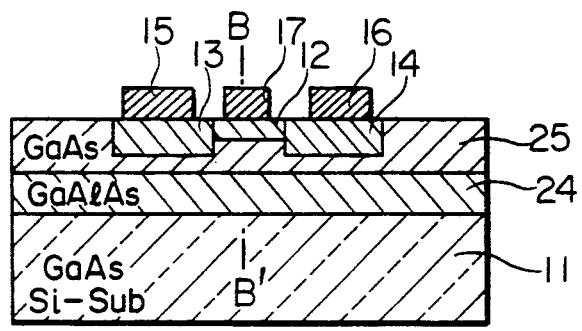
FIG. 5a is a cross section of the FET according to a third embodiment of this invention.
Figure 5B:
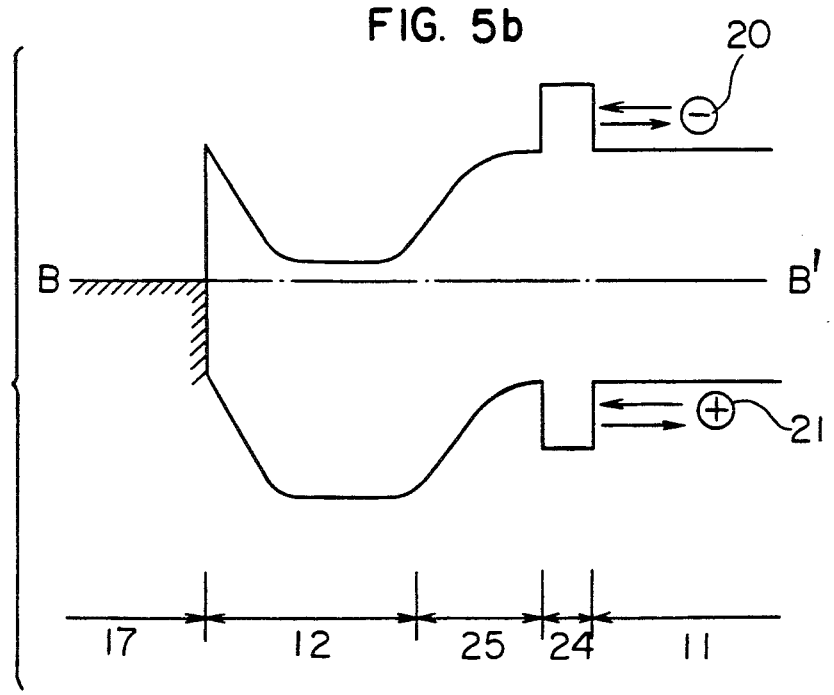

The band structure taken on line B—B' of the FET structure of Embodiment 3 as shown in FIG. 5a is shown in FIG. 5b. Since the undoped GaAlAs layer 24 forms a heterojunction with the GaAs substrate 11 and has a larger energy band gap (forbidden band width) than the GaAs substrate 11, it serves as a potential barrier for both electrons 20 and holes 21 generated in the substrate 11. Thus, both electrons 20 and holes 21 are prevented from flowing into the drain and source. Incidentally, in the prior art FET structure shown in FIG. 1, the amount of charge flowing into the FET region by the incidence of one $\alpha$-particle was about 800 fC whereas in the structure of Embodiment 3, the amount of charge flowing was about 100 fC when the composition of the mixed crystal is $Al_{0.3}Ga_{0.7}As$. In this way, also in this embodiment, the carrier multiplication effect due to the incidence of $\alpha$-particles can be suppressed.

As described above, in accordance with this invention, the carrier multiplication effect in an FET due to the incidence of $\alpha$-particles can be suppressed so that its $\alpha$-particle immunity can be increased as compared with the prior art FET. Therefore, the soft error in the memory device constituted by the FET's can also be prevented.

We claim:

1. A field effect transistor comprising:
   a compound semiconductor substrate of a second conductivity type;
   an element region disposed in a surface region of said semiconductor substrate, said element region comprising a source region and a drain region, both source and drain regions being of a first conductivity type opposite to said second conductivity type, and separated from each other, and an active region disposed between the source and drain regions; and
   a semiconductor structure disposed in said substrate between a remaining portion of said substrate and said element region, said remaining portion of said substrate being a portion other than said element region and semiconductor structure; said semiconductor structure comprising at least one layer of said second conductivity type and at least one layer of a third conductivity type, the third conductivity type being the same as the first conductivity type; said at least one layer of second conductivity type being positioned between said element region and said at least one layer of third conductivity type, and said at least one layer of third conductivity type being between said remaining portion and said at least one layer of second conductivity type; the at least one layer of second conductivity type and the at least one layer of third conductivity type in combination serving as potential barriers to the flow of both electrons and holes from the remaining portion of the substrate to the element region, so as to block flow of electrons into one of the at least one layer of second conductivity type and the at least one layer of third conductivity type and to block flow of holes into another of the at least one layer of second conductivity type and the at least one layer of third conductivity type, whereby injection of both holes and electrons, formed by incidence of $\alpha$-particles on the substrate, from the remaining portion of the substrate into the element region, is suppressed.

2. A field effect transistor according to claim 1, wherein the semiconductor substrate is semi-insulating.

3. A field effect transistor according to claim 1, wherein said semiconductor structure has a minimum value of electron affinity that is smaller than a value of electron affinity in said remaining portion of said substrate, and said semiconductor structure has a maximum value of the sum of electron affinity and forbidden band width greater than a maximum value of the sum of electron affinity and forbidden band width in said remaining portion of said substrate.

4. A field effect transistor according to claim 1, wherein the flow of electrons and holes in the at least one layer of second conductivity type and into the at least one layer of third conductivity type is blocked such that both electrons and holes remain in the remaining portion of the substrate.

5. A field effect transistor according to claim 1, wherein the semiconductor structure, comprising said at least one layer of a second conductivity type and said at least one layer of a third conductivity type, is disposed in said substrate between the remaining portion of said substrate and said element region such that both electrons and holes generated in the remaining portion of the substrate remain in the remaining portion of the substrate and are annihilated through recombination thereof.

6. A field effect transistor comprising:
   an n-type compound semiconductor substrate;
   an element region disposed in a surface region of said substrate and including n-type source and drain regions and an active region between said source and drain regions;
   a p-type semiconductor layer disposed in the substrate between a remaining portion of the substrate and said element region; and
   an $n^+$-region semiconductor layer disposed between said remaining portion of the substrate and said p-type semiconductor layer and having an impurity concentration higher than that of the semiconductor substrate, said remaining portion of the substrate being a portion other than the p-type semiconductor layer, said $n^+$-type semiconductor layer and the element region, the p-type semiconductor layer and $n^+$-type semiconductor layer in combination serving as potential barriers to the flow of both electrons and holes from the remaining portion of the substrate to the element region, whereby injection of both holes and electrons, formed by incidence of $\alpha$-particles on the substrate, from the remaining portion of the substrate into the element region is suppressed.

7. A field effect transistor according to claim 6, wherein the p-type semiconductor layer and $n^+$-type semiconductor layer in combination serve as potential barriers to the flow of both electrons and holes so as to substantially block flow of electrons into the p-type semiconductor layer and substantially block flow of holes into the $n^+$-type semiconductor layer.

8. A field effect transistor comprising:
   a semiconductor substrate;
   a first compound semiconductor layer formed on said substrate;
   an element region formed in said first semiconductor layer, said element region including source and drain regions and an active region between the source and the drain regions; and a second semiconductor layer disposed between said substrate and said first semiconductor layer and having a wider band gap than that of said substrate such that the second semiconductor layer serves as a potential barrier to the flow of both electrons and holes from the substrate to the element region, whereby injection of both holes and electrons, formed by incidence of α-particles on the substrate, from the substrate into the element region is suppressed, the element region, formed in the first semiconductor layer, being spaced from the second semiconductor layer.

9. A field effect transistor according to claim 8, wherein said semiconductor substrate is made of semi-insulating GaAs, said first semiconductor layer is made of GaAs, said element region is made of GaAs and said second semiconductor layer is made of GaAlAs.

10. A field effect transistor according to claim 9, wherein the GaAs first semiconductor layer is undoped, wherein the GaAs element region is of n-type conductivity and wherein the GaAlAs second semiconductor layer is undoped.

11. A field effect transistor according to claim 8, wherein the element region extends to a surface of the first semiconductor layer.

12. A field effect transistor according to claim 8, wherein the element region is of n-conductivity type, and wherein said second semiconductor layer is undoped.

13. A field effect transistor according to claim 8, wherein the second semiconductor layer forms a heterojunction with the substrate.

14. A field effect transistor according to claim 13, wherein the second semiconductor layer has a band gap wider than that of the substrate such that both electrons and holes are blocked from flowing into the second semiconductor layer and therethrough to the element regions.

15. A field effect transistor according to claim 14, wherein the band gap of the second semiconductor layer is wider than the band gap of the substrate and of the first semiconductor layer.

16. A field effect transistor according to claim 8, wherein the band gap of the second semiconductor layer is wider than the band gap of the substrate and of the first semiconductor layer.

17. A field effect transistor according to claim 8, wherein said second semiconductor layer, having said wider band gap than that of said substrate, blocks flow of both holes and electrons from the substrate into the second semiconductor layer.

18. A field effect transistor according to claim 8, wherein a conductivity type of the source and drain regions of said element region is the same as a conductivity type of said active region.

19. A field effect transistor according to claim 8, wherein the second semiconductor layer is disposed between said substrate and said first semiconductor layer, and has said wider band gap, such that said electrons and holes, formed by incidence of α- particles on the substrate, remain in the substrate and are annihilated by recombination thereof.

20. A field effect transistor comprising:
a semi-insulating compound semiconductor substrate;
an element region disposed in a surface region of the semiconductor substrate, the element region comprising a source region and a drain region, both of a first conductivity type and separated from each other, with an active region disposed between the source region and the drain region; and
a semiconductor structure disposed in the substrate between a remaining portion of the substrate and said element region, said remaining portion of the substrate being a portion other than the element region and semiconductor structure, the semiconductor structure comprising at least one layer of second conductivity type opposite said first conductivity type and at least one layer of first conductivity type, said at least one layer of second conductivity type being positioned between said element region and said at least one layer of first conductivity type, and said at least one layer of first conductivity type being between said remaining portion of the substrate and said at least one layer of second conductivity type, the at least one layer of second conductivity type and the at least one layer of first conductivity type in combination serving as potential barriers to the flow of both electrons and holes from the remaining portion of the substrate to the element region, whereby injection of both holes and electrons, formed by incidence of α-particles on the substrate, from the remaining portion of the substrate into the element region is suppressed.

21. A field effect transistor according to claim 20, wherein said at least one layer of second conductivity type and said at least one layer of first conductivity type include at least one n-type layer and at least one p-type layer.

22. A field effect transistor according to claim 20, wherein said at least one layer of second conductivity type is a p-type layer, said at least one layer of first conductivity type is an n-type layer, and the source and drain regions are n-type conductivity regions.

23. A field effect transistor according to claim 22, wherein the doping impurity for the p-type layer is selected from the group consisting of Be, Mg, C and Zn.

24. A field effect transistor according to claim 23, wherein the doping impurity for the n-type layer is selected from the group consisting of Si, Se and S.

25. A field effect transistor according to claim 20, wherein the semiconductor structure, comprising said at least one layer of a second conductivity type and said at least one layer of a first conductivity type, is disposed in said substrate between the remaining portion of said substrate and said element region such that both electrons and holes from the remaining portion of the substrate remain in the remaining portion of the substrate and are annihilated through recombination thereof.

26. A field effect transistor comprising:
a p-type compound semiconductor substrate;
an element region disposed in a surface region of said substrate and including p-type source and drain regions and an active region between said source and drain regions;
an n-type semiconductor layer disposed in the substrate between a remaining portion of said substrate and said element region; and
a $p^+$-type semiconductor layer disposed in the substrate between said remaining portion of the substrate and said n-type semiconductor layer, said remaining portion of the substrate being a portion other than said element region, said $p^+$-type semiconductor layer and said n-type semiconductor layer, said p+-type semiconductor layer having an impurity concentration higher than that of said semiconductor substrate, the n-type semiconductor layer and p+-type semiconductor layer in combination serving as potential barriers to the flow of both electrons and holes from the remaining portion of the substrate to the element region, whereby injection of both holes and electrons, formed by incidence of α-particles on the substrate, from the remaining portion of the substrate into the element region, is suppressed.

27. A field effect transistor according to claim 26, wherein the n-type semiconductor layer and p+-type semiconductor layer in combination serve as potential barriers to the flow of both electrons and holes so as to substantially block flow of electrons into the p+-type semiconductor layer and substantially block flow of holes into the n-type semiconductor layer.

28. A field effect transistor comprising:
   a compound semiconductor substrate;
   an element region disposed in a surface region of said semiconductor substrate, said element region comprising a source region and a drain region, both source and drain regions being of a first conductivity type and separated from each other, and an active region disposed between the source and drain regions; and
   a semiconductor structure disposed in said substrate between a remaining portion of said substrate and said element region, said remaining portion of said substrate being a portion other than said element region and semiconductor structure; said semiconductor structure comprising at least one layer of second conductivity type opposite said first conductivity type and at least one layer of a third conductivity type, the third conductivity type being the same as the first conductivity type; said at least one layer of second conductivity type being positioned between said element region and said at least one layer of third conductivity type, and said at least one layer of third conductivity type being between said remaining portion and said at least one layer of second conductivity type; the at least one layer of second conductivity type and the at least one layer of third conductivity type in combination serving as potential barriers to the flow of both electrons and holes from the remaining portion of the substrate to the element region, so as to block the flow of electrons and holes such that both electrons and holes remain in the remaining portion of the substrate, whereby injection of both holes and electrons, formed by incidence of α-particles on the substrate, from the remaining portion of the substrate into the element region, is suppressed.

29. A field effect transistor according to claim 28, wherein the semiconductor structure, comprising said at least one layer of a second conductivity type and said at least one layer of a first conductivity type, is disposed in said substrate between the remaining portion of said substrate and said element region such that both electrons and holes from the remaining portion of the substrate remain in the remaining portion of the substrate and are annihilated through recombination thereof.

* * * * *